United States Patent [19]

MacKay

[11] Patent Number: 5,053,195
[45] Date of Patent: Oct. 1, 1991

[54] BONDING AMALGAM AND METHOD OF MAKING

[75] Inventor: Colin A. MacKay, Austin, Tex.

[73] Assignee: Microelectronics and Computer Technology Corp., Austin, Tex.

[21] Appl. No.: 382,829

[22] Filed: Jul. 19, 1989

[51] Int. Cl.$^5$ ............................................. C22C 28/00
[52] U.S. Cl. .................................... 420/555; 420/590; 433/228.1
[58] Field of Search ............... 420/555, 590, 526, 503; 433/228.1

[56] References Cited

U.S. PATENT DOCUMENTS

| | | | |
|---|---|---|---|
| 2,585,393 | 2/1952 | Lyle, Jr. | 420/441 |
| 2,655,641 | 10/1953 | Asaff | 339/275 |
| 3,141,238 | 7/1964 | Harman | 29/498 |
| 3,676,112 | 7/1972 | Muhler | 433/228.1 |
| 4,159,075 | 6/1979 | Ljung et al. | 228/116 |
| 4,278,195 | 7/1981 | Singh | 228/123 |
| 4,398,975 | 8/1983 | Ohsawa et al. | 148/400 |
| 4,435,611 | 2/1984 | Ohsawa et al. | 174/68.5 |
| 4,440,829 | 4/1984 | Gerace et al. | 428/343 |
| 4,582,240 | 4/1986 | Lux et al. | 228/121 |
| 4,659,384 | 4/1987 | Daigo et al. | 420/555 |
| 4,664,629 | 5/1987 | Chodkowski | 420/503 |

OTHER PUBLICATIONS

Richard M. Waterstrat and Robert W. Longton, "Gallium-Palladium Albys as Dental Filling Material", *Public Health Reports, Public Health Service*, vol. 79, No. 7, (Jul. 1964), pp. 638-639.
Tikhomirova et al., "Effect of the Particle Shape and Size of a Second Component on the Properties of Gallium Solders." Poroshkovaya Metallurgiva, No. 12(84), Dec., 1969, pp. 51-56.
Ferrari, "Comments on the Paper 'Hard Gallium Alloys for Use as Low-Contact Resistance Electrodes and for Bonding Thermocouples into Samples", Review of Scientific Instuments.
Harman, "Some Comments on the Use and Preparation of Hard Gallium Alloys:, Review of Scientific Instruments".
Glushkove et al., "Gallium-Copper and Gallium-Nickel Paste Solders," SVAR.Proiz, No. 11, 1968, pp. 36-37.
Tikhomirove et al., "Soldering Copper with Copper-Callium Solders," Svar. Proiz., No. 10, 1967, pp. 16-18.
Harman, "Hard Gallium Alloys for Use as Low Contact Resistance Electrodes and for Bonding Thermocouples into Samples," the Review of Scientific Instruments, vol. 31, No. 7 Jul., 1960, pp 717-720.

*Primary Examiner*—R. Dean
*Assistant Examiner*—Robert R. Koehler
*Attorney, Agent, or Firm*—Fulbright & Jaworski

[57] ABSTRACT

An amalgam and a method of preparing an amalgam for bonding two articles together, which includes mixing a composition of a liquid metal and a metal powder to thoroughly wet the metal powder with the liquid metal, and thereafter mixing a composition with a pestle element for mechanically amalgamating the composition. Other additives may be provided such as ductile metals, additives containing oxides, ceramics, or other non-metallic compounds, and volatile constituents. The amalgamated composition can then wet surfaces to be bonded and harden at or near room temperature.

13 Claims, No Drawings

BONDING AMALGAM AND METHOD OF MAKING

BACKGROUND OF THE INVENTION

The present invention is directed to a bonding amalgam and method of making for bonding two articles together, and in particular for providing a novel class of metals for bonding in electronic packaging and interconnect applications.

Bonding is probably the most neglected stage in the manufacturing sequence of electronic and microelectronic devices and assemblies. Most recent activity in the development of bonding materials has been directed toward polymer-based adhesives, which do not meet military standards. If metal alloys are required, then only traditional solders are available. Solders are unsatisfactory as they are subject to thermal cycle fatigue, require high bonding temperatures producing stress in the article being soldered, and have upper temperature limitations at their melting points.

It has been suggested in U.S. Pat. No. 3,141,238 that amalgams can be used for bonding in a manner analogous to their use in dentistry. An amalgam is a mechanically alloyed composition formed by a liquid metal and a metal powder. Amalgams in general have low processing temperatures, down to near room temperature, yet they yield materials with thermal stabilities between 250 and 600 degrees C. depending upon the materials. However, the composition and formulation of the compositions Of materials called amalgams in the prior art have not provided satisfactory bonding in electronic applications. Dental applications of amalgams rely upon a mechanical locking of the filler in the dental cavity because of a slight expansion of the amalgam. But in electronics, bonds involving adhesion and metallurgical interaction between surfaces are required and neither the dental amalgams nor the prior art materials can satisfactorily achieve this.

The present invention is also directed to a method of making a bonding amalgam that will achieve bonding of flat and co-axial geometries for application in electronic package bonding for die attach, hermetic sealing, heat sink attachment, innerlead bonding for tape automated bonding (TAB), and via filling of through holes in ceramic substrates.

SUMMARY

The present invention is directed to a method of preparing amalgams for bonding two articles together and includes mixing a composition together having a liquid metal or alloy sufficient to produce a fluid material that can readily be made to wet a joint surface, and a metal powder constituting the rest of the composition. The composition is mixed thoroughly to wet the metal powder with the liquid by a separate operation or by operation of a pestle element, and thereafter the composition is mixed with the pestle element which mechanically amalgamates the composition. That is, in some embodiments the pestle can both wet and hammer the powder. The amalgam produced is particularly advantageous for microelectronic bonding which frequently requires a joint between two flat surfaces. In order to provide a good bond, a metallurgical bond is required at the interfaces, which in turn requires wetting between the filler metal and the joint surfaces. In addition, after such wetting action the material is required to become hard, with a significant melting point, at or near room temperature. This wetting operation is the essential action which produces a material that will be fluid enough to allow wetting and the formation of a metallurgically sound joint. The hammering action of amalgamation initiates the reaction between the liquid and the powder metals which is the essential mechanism for producing a fluid material which will subsequently harden at or near room temperature.

Still a further object of the present invention is wherein the composition is mixed in an amalgamator at approximately 3600 cpm for a time sufficient to fully wet all the powder, typically 1 to 20 seconds, and thereafter at approximately 3000 cpm for a time sufficient to produce a fluid amalgamated mix in which every powder particle carries a thin film skin of reaction product of the liquid component and the powder component, a typical time being 3 to 5 seconds. These conditions are critically dependent upon the system of liquid metal or alloy and powders being used.

Yet a still further object of the present invention is wherein the metal powder includes ductile particles selected from a group consisting of aluminum, molybdenum and tungsten for providing a more ductile matrix in the cured amalgam.

Still a further object of the present invention is wherein the composition includes additives selected from a group of oxides, ceramics, alumina, diamond, graphite, nitrides, phosphides, and sulfides for providing enhancements such as a harder, more corrosion-resistant, surface active, and wear resistant amalgam.

A still further object of the present invention is wherein a volatile constituent, such as zinc or mercury, is included within the liquid metal so that while allowing amalgamation there will be an ample amount of fluid to facilitate surface wetting of the surfaces of a joint. During cure the amount of fluid can be reduced so that when fully cured the amount of reaction product, which is dictated by the amount of fluid, can be reduced and the proportion of elemental powder metal, which effects joint ductility, can be controlled.

A still further object of the present invention is wherein the liquid metal is gallium and the metal powder includes nickel and copper. In one embodiment, the composition includes approximately 65% gallium, 30% copper, and 5% nickel by weight.

Other and further objects, features and advantages will be apparent from the following description of presently preferred embodiments of the invention, given for the purposes of disclosure.

DESCRIPTION OF THE PREFERRED EMBODIMENT

An amalgam is defined as a non-equilibrium, mechanically alloyed material formed between a liquid metal and a powder. Combinations of the following are some of the possible compositions:

TABLE 1

| Liquids (Melting Point, degrees C.) | Powders |
| --- | --- |
| Gallium (30) | Antimony |
| Indium (259) | Cobalt |
| Gallium/Tin (16) | Copper |
| Gallium/Indium (15) | Chromium |
| Gallium/Indium/Tin (5) | Germanium |
| Other Combinations with | Gold |
| Mercury, Cadmium, and | Iron |
| Bismuth | Nickel |
| | Magnesium |
| | Manganese |

TABLE 1-continued

| Liquids (Melting Point, degrees C.) | Powders |
| --- | --- |
| | Platinum |
| | Silver |
| | Vanadium |

Amalgams harden or cure by reaction of the liquid with the powder to form intermetallic compounds between the powder particle cores. This reaction product is initiated around each powder particle by the hammering action of a pestle element during the amalgamation process. Use of certain of the above liquids and powders has been suggested in the prior art. However, the composition ranges and mixing conditions which were used do not produce materials capable of satisfactorily bonding flat or co-axial geometries, particularly for microelectronic bonding where there is a need to make a joint between two surfaces. Applicant has found that to produce the required metallurgical bond at the interfaces of such surfaces requires good wetting between the filler metal and the joint surfaces. Applicant has also found that for good bonding, the material must be more fluid than that described in the prior art. Applicant has determined optimum composition ranges and amalgamation conditions to achieve the wetting to make a strong joint.

A commercial dental amalgamator, for example a Caulk "VARI MIX" (trademark) II, was used to make Ga-Cu, Ga-Ni, Ga-Ag and Ga-Ni-Cu amalgams. A matrix experiment has been completed using Ga-Ni as the test system, to determine the significance and interrelation of the main amalgamation parameters of amalgamation time, amalgamation frequency, composition, gallium temperature and charge size. From this, the parameter settings were found that were necessary to make fluid mixes that remained liquid for up to 4 hours (to give long work life) and yet would set hard in 1.5 hours at 100 degrees C. The hardening, however, could also occur at room temperature if desired, in which case the hardening time would be increased. These amalgams readily wetted alumina, silicon, beryllia, GaAs, copper, stainless steel, molybdenum and tungsten without metallization. Lap joints between electro-deposited copper foil gave maximum shear strengths of 750 gms for a 3/16 inch squared joint. Simulated die shear tests using a ¼ in.×3/16 inch alumina die on alumina gave shear values up to 102 Kg. (in excess of 7000 PSI). Thermal expansion for this material ranges from 4.8 ppm (15-25 degrees C.) to 39.8 ppm (145-155 degrees C.), although there were differences dependant upon composition and cure history. Thermal conductivity was typically 46 W/m degree K. Electrical resistivity was typically 28 to 32 micro-ohm-cm.

It is to be noted that in order to obtain the necessary wetting and joint strength in the test system, the composition included a mixture of liquid metal which formed greater than 60% of the composition and a metal powder comprising less than 40% of the composition. Such a composition was able to wet a surface for making the necessary bond as well as providing sufficient liquid to wet and interact with the powdered particles. Prior art compositions provided a texture which was stiff to almost a powdery consistency and which would not wet and provide continuous filling in void free joints. In addition, the prior art method of mixture generally used a hand-mixing pestle which then required placing joints together under pressure and relying upon temperature to make the reaction between the liquid metal and the metal powders. Applicant, on the other hand, mixes the composition with a pestle element for mechanically amalgamating the composition to mechanically interact the liquid metal and the powdered metal to produce the alloying without requiring bonding pressure between the articles to be bonded and without requiring increased temperatures for curing. The composition is mixed to thoroughly wet the metal powder with liquid metal so that a uniform coating of liquid metal is formed over essentially every metal powder particle. For example, using the above-described dental amalgamator, the compositions were mixed at approximately 3600 cpm for approximately one to twenty seconds which caused a mixing or wetting action of the composition. During this procedure, the steel ball or vibrating hammer in the amalgamator was impeded from hitting against the sides so long as it was encountering non-wetting powder. However, at the conclusion of the wetting process, the pestle would strike the sides of the amalgamator and could be heard to do so. Thereafter the frequency of operation was reduced to 3000 cpm for a period of approximately three to five seconds, which was sufficient to initiate the chemical action between the liquid and the powder yet still provide material of sufficient fluidity to wet flat or co-axial geometric surfaces when applied along with a pressure and abrasion, and which would remain in this condition from 240 to 360 minutes at 30 degrees C.

Cu-Ga amalgamation conditions did not translate from the Ni-Ga system. Powder particle size and age were far more critical. Joint strengths up to 700 g were obtained with copper foil lap joints and die shear test values up to 25 Kg were obtained. This system did not wet so readily and the spread of results reflects this. Thermal cycle performance with this system was good, giving 0% failures out to 2500 cycles from −65 to +150 degrees C. for copper/copper and copper coated alumina samples. Hardening times in this system, however, were very extended (72 hours to 96 hours).

Trials with a Ni-Cu-Ga ternary indicate that properties may be additive in that thermal cycle results in excess of 1200 cycles from −65 to +150 degrees C. were achieved for silicon on alumina, with strength values near those for the nickel system at hardening times intermediate between the two. Also, the same good wetting characteristics as for nickel were maintained.

In some tests, it was observed that the tendency for the copper compound in the Ga-Cu system is to form large orthorhombic crystals which produce marked shrinkage in the meniscus. This greatly increases the chances of voids and gross leakage in this bond. In the Ga-Ni-Cu system, solidification is with finer grains, and this does not happen.

Die attach samples with shear strengths between 7X and 18X, the maximum required by MIL-SPEC-883C, have been made. Wetting, without metallization, to a broad variety of materials has been demonstrated and bond-strengths which satisfy military requirements. Satisfactory thermal cycle performance for military requirements has been demonstrated.

The gallium-based liquids which were investigated showed an ability to wet a large range of oxides, ceramics and semiconductor materials directly, which offers opportunities to use fewer or no extra metallization layers. Implicit in this, for example, would be the possibility of using plain, unpolished ceramics for hermetic seal lids with the amalgam both wetting the ceramic directly and also compensating for the flatness irregularities which is the main problem with ceramic lids at present.

Another possibly desirable use is the inclusion of ductile particles (powder cores) in a matrix of more brittle compounds to give the best mechanical and thermo-mechanical properties. That is, some elements that while wetted with gallium do not react with it could provide ductile characteristics Examples are aluminum, molybdenum, and tungsten.

Other possible additives to the amalgam composition are oxide and ceramic or other non-metal additives such as alumina, diamond, graphite, nitrides, phosphides, and sulfides. Such additives can provide, for instance, a hardened and more corrosion-resistant bond, increased wear resistance, as well as a surface active property which specifically attracts certain undesirable materials such as carbon monoxide, oil, or curing agents in plastics.

The following examples illustrate the test results testing three compositions recommended in U.S. Pat. No. 3,141,238, and three compositions by the present inventor found to be usable for bonding. The compositions were then formulated according both to the '238 patent and to the present method of formulation. The '238 formulation consists of where the components of the material are blended together in a hand mixing operation designed to simply wet the powder particles by the liquid metal. The present method of formulation involves the use of a commercial dental amalgamator machine in which the materials are constrained in a capsule together with a steel pestle shaped like a roller bearing and mechanically agitated by vibrations at frequencies of 3600 and 3000 cycles per minute as described above. However, during this action, the roller bearing vigorously hammers the powder fraction in the presence of the liquid metal. This hammering action initiates the reaction between the liquid and powder metals which is an essential mechanism for producing a fluid material that allows formation of a metallurgically bonded joint and which will subsequently harden at or near room temperature.

The results of "Fluid" indicates whether the formulated composition is fluid, "Wet Surface" indicates whether the surface of the bonded joints produces a fluid wet surface, and the term "Makes Joint" indicates whether a void-free overlap joint resulted.

EXAMPLE 1

Using the '238 compositions and method of formulation, the results are as follows:

| Composition | Fluid | Wets Surf. | Makes Joint | Set-Up Time min. (35 C.) | Cures Time min. (100 C.) |
| --- | --- | --- | --- | --- | --- |
| 66% Cu—Ga | NO | NO | NO | 20 | 25 |
| 65% Ni—Ga | NO | NO | NO | 35 | 100 |
| 44% Cu 24% Sn—Ga | NO | ? | NO | 350 | 200 |

EXAMPLE 2

Using the '238 compositions but using the formulations of the present invention, the results are as follows:

| Composition | Fluid | Wets Surf. | Makes Joint | Set-Up Time min. (35 C.) | Cures Time min. (100 C.) |
| --- | --- | --- | --- | --- | --- |
| 66% Cu—Ga | NO | NO | NO | 20 | 25 |
| 65 Ni—Ga | NO | NO | NO Hard in Capsule | | |
| 44% Cu 24% Sn—Ga | NO | NO | NO | 40 | 65 |

EXAMPLE 3

This example used the compositions of the present invention, but formulated them in accordance with the teaching of the '238 patent with the following results:

| Composition | Fluid | Wets Surf. | Makes Joint | Set-Up Time min. (35 C.) | Cures Time min. (100 C.) |
| --- | --- | --- | --- | --- | --- |
| 35% Cu—Ga | Y | Y | Y | NO | NO |
| 30% Ni—Ga | Y | Y | Y | NO | 4500 |
| 5% Ni 30% Cu—Ga | Y | Y | Y | 4500 | 4000 |

EXAMPLE 4

Using the compositions of the present invention along with the formulation of the composition by the present invention, the results are as follows:

| Composition | Fluid | Wets Surf. | Makes Joint | Time min. (35 C.) | Cures Time min. (100 C.) |
| --- | --- | --- | --- | --- | --- |
| 35% Cu—Ga | Y | Y | Y | 1000 | 1500 |
| 35% Cu—Ga | Y | Y | Y | 400 | 45 |
| 5% Ni 30% Cu—Ga | Y | Y | Y | 700 | 90 |

The above results show that for the composition materials and method of formulation as disclosed in the '238 patent Example 1, the texture is stiff almost powdery consistency, the compositions cannot be made to wet a surface, and will not make overlap type joints. Even with considerable scrubbing, there is little evidence of any liquid phase on the surface of a joint member.

Using the composition materials of the '238 patent, and formulating them according to the present invention, Example 2, the composition is equally or more stiff and performs as poorly from the joint-making viewpoint.

In Example 4, using the composition of the present invention and formulated by the present invention, Example 4 produces fluids which readily wet flat surfaces and make continuous, void-free overlap joints. The joints remain liquid at 35 degrees C. for between one and four hours and then harden, becoming firm (reach 100 durometer) in about twelve to fifteen hours after the onset of solidification. The hardening may be accelerated by elevated temperatures so that they become firm after only thirty to fifty minutes at 100 degrees C. and fully harden after only sixty to five hundred minutes.

However, using the present compositions, but formulated according to the ,238 method, Example 3, the materials never fully hardened at 35 degrees C. At 100 degrees C. they took about three hundred to five hundred minutes to become firm and only the 30% nickel composition achieved the ultimate final hardness.

The above experiments were carried out to twelve thousand minutes but only in Example 4, using the present compositions and methods of formulations, did the materials produce fluid, wet flat surfaces, and make void-free joints.

Trials have shown that mercury-based systems did not lend themselves to hardening acceleration by temperature. The high vapor pressure of mercury results in evaporation of the liquid, and the amalgam becomes a powder. Because of the toxicity of mercury vapor, mercury containing compositions would be used only if the process advantages outweigh the difficulties in the necessary safety precautions. Volatization of mercury could be used to advantage when it is alloyed with other elements in the liquid. Gallium, by comparison, has a boiling point of 1983 degrees C. so that at room temperature the partial pressure is then significant and the alloys are stable.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, compositions, elements used, and steps of the process, will be readily apparent to those skilled in the art and which are encompassed within the spirit of the invention and the scope of the appended claims.

What is claimed is:

1. A method for preparing an amalgam for bonding two articles together comprising,
   mixing the composition to thoroughly wet the metal powder with the liquid metal, and
   thereafter mixing the composition with a pestle element and mechanically amalgamating the composition, wherein the mixing is in an amalgamator at approximately 3600 cpm for approximately 1-20 seconds and thereafter at approximately 3000 cpm for approximately 3-5 seconds.

2. The method of claim 1 wherein the liquid metal is selected from the group consisting of gallium, indium, gallium/tin, gallium/indium, and gallium/indium/tin.

3. The method of claim 2 wherein the liquid metal further contains a material selected from the group consisting of mercury, cadmium, and bismuth.

4. The method of claim 1 wherein the metal powder is selected from the group consisting of antimony, cobalt, copper, chromium, germanium, gold, iron, nickel, magnesium, manganese, platinum, silver, and vanadium.

5. The method of claim 1 wherein the metal powder includes ductile particles selected from the group consisting of aluminum, molybdenum, and tungsten for providing a more ductile amalgam.

6. The method of claim 1 wherein the composition includes additives selected from the group of ceramics, diamond, graphite, nitrides, phosphides, and sulfides.

7. The method of claim 1 wherein the liquid metal is gallium and the metal powder includes nickel and copper.

8. The method of claim 7 wherein the composition includes approximately 65% gallium, 30% copper, and 5% nickel by weight.

9. The method of claim 1 wherein the liquid metal forms greater than 60% by weight of the composition and the metal powder forms 40% by weight or less of the composition.

10. The method of claim 1, wherein the composition further includes a volatile constituent, wherein the evaporation of said volatile constituent controls the final proportion of the final reacted intermetallic compound in the amalgam.

11. The method of claim 10 wherein the volatile constituent is selected from the group consisting of zinc and mercury.

12. The method of claim 1, wherein the composition includes as an additive oxides.

13. The method of claim 1, wherein the composition includes as an additive alumina.

* * * * *

UNITED STATES PATENT AND TRADEMARK OFFICE
CERTIFICATE OF CORRECTION

PATENT NO. : 5,053,195
DATED : October 1, 1991
INVENTOR(S) : Colin A. Mackay

It is certified that error appears in the above-indentified patent and that said Letters Patent is hereby corrected as shown below:

Column 1, line 31, before "materials"change "of to --of --.
Column 5, line 9, after "characteristics" add --.--
Column 6, line 41, after "is" add --a --.
Column 6, line 64, before "method" change ",238" to --'238 --
Column 7, line 33, add the following paragraph --mixing a composition together having a liquid metal and metal powder.

Signed and Sealed this

Twenty-first Day of June, 1994

*Attest:*

BRUCE LEHMAN

*Attesting Officer*     *Commissioner of Patents and Trademarks*